(12) United States Patent
Gopal et al.

(10) Patent No.: US 10,230,392 B2
(45) Date of Patent: Mar. 12, 2019

(54) TECHNIQUES FOR PARALLEL DATA DECOMPRESSION

(71) Applicant: INTEL CORPORATION, Santa Clara, CA (US)

(72) Inventors: Vinodh Gopal, Westborough, MA (US); James D. Guilford, Northborough, MA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/393,190

(22) Filed: Dec. 28, 2016

(65) Prior Publication Data

US 2018/0183462 A1 Jun. 28, 2018

(51) Int. Cl.
*H03M 7/00* (2006.01)
*H03M 7/40* (2006.01)
*H03M 7/30* (2006.01)

(52) U.S. Cl.
CPC ............ *H03M 7/40* (2013.01); *H03M 7/3086* (2013.01)

(58) Field of Classification Search
CPC ........ H03M 7/30; H03M 7/3088; H03M 7/40; H03M 7/3086; H03M 7/3059; H03M 7/3084; H03M 7/42; H03M 7/4006; H03M 7/46; H03M 7/48; H03M 7/6005; H03M 7/6023; H03M 7/6029; H03M 5/14; H03M 7/4037
USPC ......................... 341/51, 65, 67, 87, 106, 107
See application file for complete search history.

(56) References Cited

U.S. PATENT DOCUMENTS

| | | | | |
|---|---|---|---|---|
| 5,717,394 A | * | 2/1998 | Schwartz ............ | H03M 7/4006 341/107 |
| 7,205,912 B1 | * | 4/2007 | Yang ................. | G11B 20/10009 341/59 |
| 2002/0091905 A1 | * | 7/2002 | Geiger .................... | H03M 7/30 711/170 |
| 2005/0175250 A1 | * | 8/2005 | Watanabe .............. | H04N 19/63 382/247 |
| 2008/0266147 A1 | * | 10/2008 | Shigenobu ............ | H03M 7/425 341/67 |
| 2009/0278715 A1 | * | 11/2009 | Fenney ................ | H03M 7/4006 341/51 |
| 2010/0127904 A1 | * | 5/2010 | Oxman .................... | H03M 7/40 341/107 |
| 2011/0248872 A1 | * | 10/2011 | Korodi ..................... | H03M 7/40 341/67 |
| 2012/0081242 A1 | * | 4/2012 | He .......................... | H03M 7/40 341/107 |
| 2015/0109154 A1 | * | 4/2015 | Harnik .................... | H03M 7/40 341/65 |

* cited by examiner

*Primary Examiner* — Linh Nguyen

(57) ABSTRACT

Techniques and apparatus for parallel decompression are described. In one embodiment, for example, an apparatus to provide parallel decompression may include at least one memory and logic for a decompression component, at least a portion of the logic comprised in hardware coupled to the at least one memory, the logic to determine decompression information of a compressed data unit, annotate the compressed data unit with at least a portion of the decompression information to generate an annotated data unit, parallel-decode the annotated data unit to generate a plurality of intermediate elements, and decode and merge the plurality of intermediate elements to generate a decompressed data unit. Other embodiments are described and claimed.

23 Claims, 8 Drawing Sheets

*File Header*
*305*

| Offset | Length | Contents |
|---|---|---|
| 0 | 2 bytes | magic header 0x1f, 0x8b (\037 \213) |
| 2 | 1 byte | compression method |
| | | 0: store (copied) |
| | | 1: compress |
| | | 2: pack |
| | | 3: lzh |
| | | 4..7: reserved |
| | | 8: deflate |
| 3 | 1 byte flags | bit 0 set: file probably ascii text |
| | | bit 1 set: continuation of multi-part gzip file, part number present |
| | *320* | bit 2 set: extra field present |
| | | bit 3 set: original file name present |
| | | *bit 4 set: file comment present* |
| | | bit 5 set: file is encrypted, encryption header present bit |
| | | 6,7: reserved |
| 4 | 4 bytes | file modification time in Unix format |
| 8 | 1 byte | extra flags (depend on compression method) |
| 9 | 1 byte | OS type |
| [ ]? | 2 bytes | optional part number (second part=1) |
| [ ]? | 2 bytes | optional extra field length (e) (e)bytes optional extra field |
| [ ]? | bytes | optional original file name, zero terminated |
| [ ]? | bytes | *optional file comment, zero terminated* |
| [ ]? | 12 bytes | optional encryption header |
| | | *330* |
| | bytes | compressed data |
| | 4 bytes | crc32 |
| | 4 bytes | uncompressed input size modulo 2^32 |

*FIG. 3*

Storage Medium 700

Computer-Executable
Instructions for 600

*FIG. 7*

TECHNIQUES FOR PARALLEL DATA DECOMPRESSION

TECHNICAL FIELD

Embodiments herein generally relate to information processing, and more particularly, to data decompression techniques.

BACKGROUND

Computing and network systems rely on the use of compressed data in order to meet the demands of data storage and delivery. In general, compression processes may be employed to reduce the size of data without sacrificing the information contained within the data. However, data consumers are required to decompress the compressed files before using the data. Conventional decompression methods generally employ serial sequential execution of discrete decompression steps until all of the data is decompressed. Such techniques incur significant resource and time costs, particularly for large files. Accordingly, data decompression techniques are needed that are capable of providing efficient and accurate decompression results.

BRIEF DESCRIPTION OF THE DRAWINGS

FIG. 3 illustrates an example of a portion of an illustrative compressed file according to an embodiment.

FIG. 7 illustrates an example of a storage medium.

DETAILED DESCRIPTION

Figure 1:
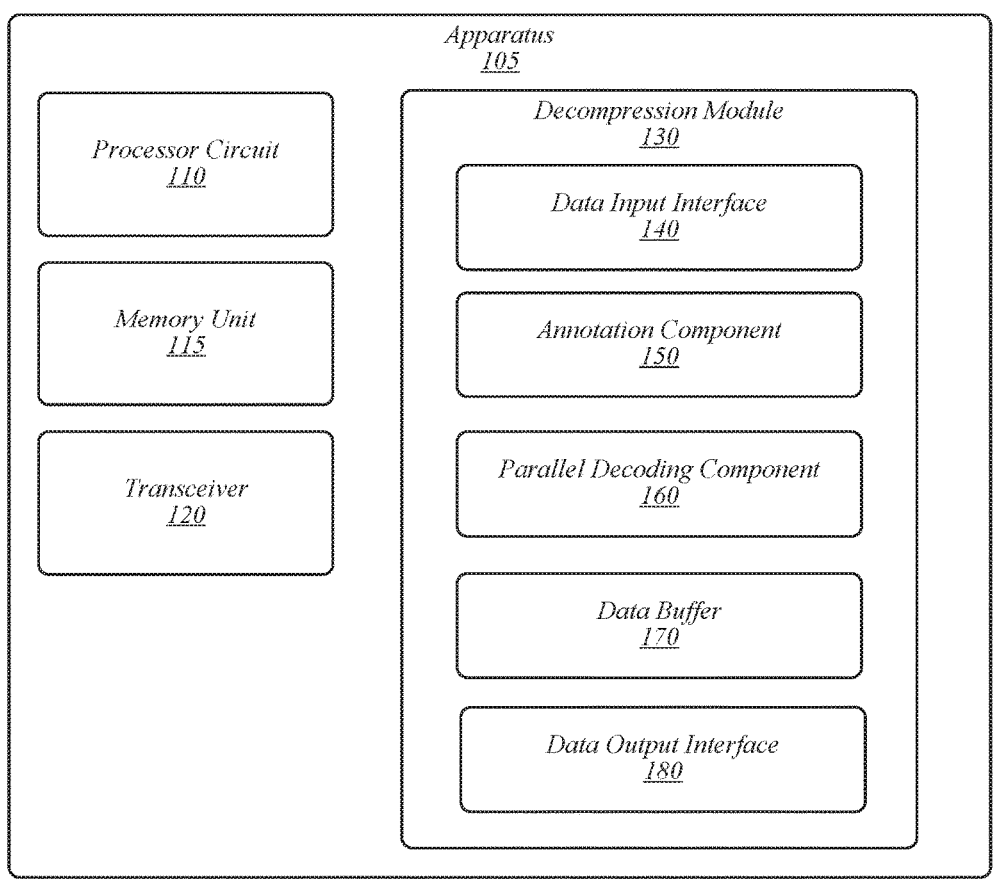
FIG. 1 illustrates an embodiment of a first operating environment.

Various embodiments may be generally directed to techniques for data decompression provided by a computer system. The computer system may include a decompression module operative to perform a parallel decompression process. In some embodiments, a compressed file or at least a portion of a compressed file may be annotated to include decompression information. In various embodiments, the decompression information may include metadata configured to indicate parameters, instructions, bit positions, and/or other information used during the parallel decompression process. In some embodiments, the parallel decompression process may include one or more of a setup phase, a parallel-decode phase, or a merge phase. During the setup phase, the decompression information may be read from a compressed file or at least a portion of a compressed file (for instance, a header) to generate setup elements, such as lookup tables, data blocks, and/or other data structures. During the parallel-decode phase, segments of the compressed file may be decoded in parallel to generate intermediate elements. The merge phase may operate to decode and/or merge the intermediate elements to form a decompressed file or stream.

For example, in an embodiment, an apparatus to provide parallel decompression may include at least one memory and logic for a decompression component, at least a portion of the logic comprised in hardware coupled to the at least one memory, the logic to determine decompression information of a compressed data unit, annotate the compressed data unit with at least a portion of the decompression information to generate an annotated data unit, parallel-decode the annotated data unit to generate a plurality of intermediate elements, and decode and merge the plurality of intermediate elements to generate a decompressed data unit.

In general, conventional decompression techniques involve very sequential processes of decoding symbols in a compressed data stream. Non-limiting examples of compression processes may include lossless data compression, Lempel-Ziv (LZ), LZ77, LZ4, LZFX, LZSS, Deflate, Snappy, Huffman encoding, compressed adaptive index (COMPAX), improved COMPAX (ICX), single-pass recompression (SPR), and/or the like. Decompression of Deflate-compressed files may be referred to as "Inflate." Although LZ77, LZ4, and Deflate are used as examples, embodiments are not so limited. In particular, compression processes capable of operating according to some embodiments are contemplated herein.

In general, the LZ77 compression process operates by replacing repeated occurrences of data with references to a single copy of that data existing earlier in the input (uncompressed) data stream. A match is encoded by a pair of numbers called a length-distance pair ("distance" may be referred to as an "offset"). As such, the LZ77 compression process finds repeated substrings and replaces them with backward references (relative distance offsets). The LZ77 compression process can use a reference to a duplicated string if the relative distance is less than the maximal history size defined in the algorithm encoding (for instance, 32 KB in Deflate). The compressed data consists of a series of elements of two types: literal bytes (copy of the data) and pointers to replicated strings, where a pointer is represented as the pair <length, backward distance>. The various algorithms in the LZ77 family all find LZ77 string matches during compression, but encode the literals or references differently (for instance, Huffman codes in Deflate, simple byte-oriented packing in Snappy, and/or the like), and have different maximal history windows. In general, a literal may include raw encoded data (as opposed to data encoded as a length, distance pair).

To spot matches, the LZ77 encoder keeps track of some amount of the most recent data, such as the last 2 kB, 4 kB, 32 kB, and/or the like. The structure in which this data is held is called a "sliding window" (accordingly, LZ77 is sometimes referred to as sliding window compression). The encoder keeps the most recent data within the sliding window to look for matches (and the decoder likewise will keep this data to interpret the matches the encoder refers to).

During LZ77 compression, bit patterns of a preceding (earlier or older) portion of a bit stream may be compared against a current portion (or current bit sequence) of the bit stream. If a sequence of bits is found in the current portion that matches a sequence of bits in the preceding portion (or preceding bit sequence), the sequence of bits in the current portion is replaced with a reference to the same sequence of bits in the earlier portion.

The reference that is inserted for the current bit sequence identifies the length of the current bit sequence and the location of the preceding bit sequence expressed, for instance, as a "distance" from the current bit sequence to the matching preceding bit sequence. As such, the LZ77 compression process encodes a bit sequence as a "length, distance pair" that is inserted in the bit stream in place of a current bit sequence. Upon decoding the compressed stream, when the decoder reaches the length, distance pair that is embedded in the bit stream, the decoder uses the distance part of the length, distance pair to refer back to the start of the matching bit sequence and reproduces the correct bit sequence of the decoded stream by reproducing a number of bits from the start of the matching bit sequence that is equal to the length component of the length, distance pair.

The Deflate compression process is used as the bases of various compression platforms, such as gzip/Zlib and Winzip/PKzip. In general, Deflate uses a series of blocks corresponding to successive blocks of input data. Each block may be compressed using a combination of the LZ77 compression process and Huffman coding. As described above, the LZ77 compression process operates to find repeated substrings and replaces the repeated substrings with references, such as relative distance offsets. The LZ77 compression process may use a reference to a duplicated string occurring in the same block or previous blocks, for instance, up to 32 KB previous input bytes. The compressed data may include a series of elements of two types: literal bytes and pointers to replicated strings (represented as the pair: <length, backward distance>. The LZ77 compression process operates to find string matches at each position.

In many systems, decompression latencies may be critical to system performance and user experience. In general, conventional decompression may include sequential processes of decoding symbols in the compressed data stream. For example, the process of decompressing LZ77 streams has the following two phases: (1) decoding the input stream into tokens (literals or references to repeated strings) and (2) copying either the literal bytes or repeated strings (for example, with specified length and offset) to the output stream. The tokens may be in a highly compressed bitstream using entropy-encoding (for example, Deflate) or in simpler packaging methods such as LZF, Snappy, LZ4, and/or the like. In conventional formats, each token is typically of a variable size, making it impossible to know for sure where a subsequent token is without decoding and processing the first token. Therefore, conventional decoding is necessarily a serial process, which is a fundamental limiter of performance when decompressing large files.

Accordingly, in some embodiments, a parallel decompression process may be performed to decompress portions of a compressed data file or stream using a plurality of cores and/or threads operating on the compressed data in parallel. For example, in some embodiments, decompression information (such as metadata) may be inserted into a compressed file with at least a portion of the decompression information providing indexing into regions of the compressed bit stream of the compressed file. The parallel decompression process may access the decompression information and decompress the compressed file in parallel across a plurality of cores and/or threads for efficient, effective single-stream performance. More specifically, a parallel decompression process may operate to increase the speed of decompression by, among other things, breaking up the sequential decompression process into multiple parallel tasks that may be executed in parallel on multiple cores, threads, heterogenous "little cores," and/or the like. In addition, parallel decompression processes according to some embodiments may operate on existing compressed file formats, such as a gzip file format (for example, a file having a *.gzip extension, a file compressed using Deflate, and/or the like). Accordingly, a gzip file annotated with decompression information may be decompressed using conventional methods, software, processes, and/or the like. Parallel decompression processes according to some embodiments may reduce the time required to decompress a compressed file by about 10-fold (for instance, for Deflate) compared with conventional decompression techniques.

Various embodiments may comprise one or more elements. An element may comprise any structure arranged to perform certain operations. Each element may be implemented as hardware, software, firmware, or any combination thereof, as desired for a given set of design parameters or performance constraints. Although an embodiment may be described with a limited number of elements in a certain topology by way of example, the embodiment may include more or less elements in alternate topologies as desired for a given implementation. It is worthy to note that any reference to "one embodiment" or "an embodiment" means that a particular feature, structure, or characteristic described in connection with the embodiment is included in at least one embodiment. The appearances of the phrases "in one embodiment," "in some embodiments," and "in various embodiments" in various places in the specification are not necessarily all referring to the same embodiment.

FIG. 1 illustrates an example of an operating environment 100 that may be representative of various embodiments. The operating environment 100 depicted in FIG. 1 may include an apparatus 105 having a processor circuit 110, a memory unit 115, and a transceiver 120. Processor circuit 110 may include and or may access logic having instructions for performing operations according to some embodiments. Processor circuit 110 may be communicatively coupled to memory unit 115 and/or transceiver 120.

As shown in FIG. 1, apparatus 105 may include a decompression module 130. In various embodiments, decompression module 130 may be implemented in software, for example, executed via processor circuit 110. In some embodiments, decompression module 130 may include or be disposed within a processor circuit, such as processor circuit 110, a system-on-a-chip (SoC), a field-programmable gate array (FPGA), and/or the like. In some embodiments, decompression module 130 may include a processor circuit. In some embodiments, decompression module 130 may be implemented in software, firmware, hardware, or any combination thereof. In various embodiments, decompression module 130 may be implemented at least partially in hardware configured to execute software, firmware, and/or the like for performing at least a portion of operations according to some embodiments.

Decompression module 130 may include a data input interface 140 configured to access data, for example, to be decompressed via decompression module 130 (for instance, "compressed data," "compressed files," "compressed data streams," "zip files," "encoded data," and/or the like). Data input interface 140 may receive data input from various sources, including software applications or threads, hardware elements, data buffers, and/or the like. In various embodiments, the compressed data in the form of a data sequence or stream may be received or otherwise accessed by decompression module 130 via data input interface 140. A data buffer 170 may be used to store data, such as intermediate data, data structures, data waiting to be decompressed, decompressed data waiting to be transmitted, portions thereof, and/or the like. Furthermore, decompression module 130 may include a data output interface 180 operative to output decompressed data, such as a decompressed data stream generated by decompression module 130. In some embodiments, data output interface 180 may access decompressed data stored within data buffer 170 for transmission to a data consumer of the decompressed data (for instance, a software application, an apparatus component, such as processor circuit 110, transceiver 120, and/or the like).

In some embodiments, decompression module 130 may include annotation component 150. In general, annotation component 150 may operate to generate annotated files by annotating or otherwise modifying data units, such as data files or streams, to include decompression information. Non-limiting examples of decompression information may include index values, data locations (such as data block locations), data structures (for instance, Huffman trees), offset values, and/or the like. In various embodiments, annotation component 150 may annotate a compressed file compressed using a compression format, such as a gzip file compressed using a LZ77 format, in a manner that the compressed file may be decompressed using a conventional process for the compression format. In some embodiments, annotation component 150 may annotate previously-compressed files. For instance, annotation component 150 may operate to decompress a previously-compressed file and annotate a portion of the compressed file. In some embodiments, annotation component 150 may annotate a file during an initial compression process.

As shown in FIG. 1, decompression module 130 may include a parallel decoding component 160. In general, parallel decoding component 160 may operate to perform a parallel decoding process on annotated files. Parallel decoding component 160 may be implemented in software, firmware, hardware, or any combination thereof. In some embodiments, parallel decoding component 160 may include or may use a plurality of cores or threads to perform decompression on portions of an annotated file. For example, an annotated file may include decompression information providing pointers, an index, offset information, or other indicators of segments of the annotated file. For example, the decompression information may indicate blocks, chunks, or other segments of the annotated file.

In some embodiments, parallel decoding component 160 may initiate the parallel decompression process by setting up data structures (for instance, setup elements) to perform parallel decompression. Non-limiting examples of setup elements may include lookup tables, arrays, trees, and/or the like. The setup elements may be generated based on, among other things, the decompression information in the annotated file. Parallel decoding component 160 may perform a parallel-decode process on the annotated file to generate a plurality of intermediate elements. In some embodiments, an intermediate element may include a sequence of data indicating various information associated with decompressing the annotated file (see, for example, FIG. 5). Parallel decoding component 160 may perform a merge process to decode the intermediate elements and/or to merge the intermediate elements to generate a decompressed output file or stream.

Figure 2:
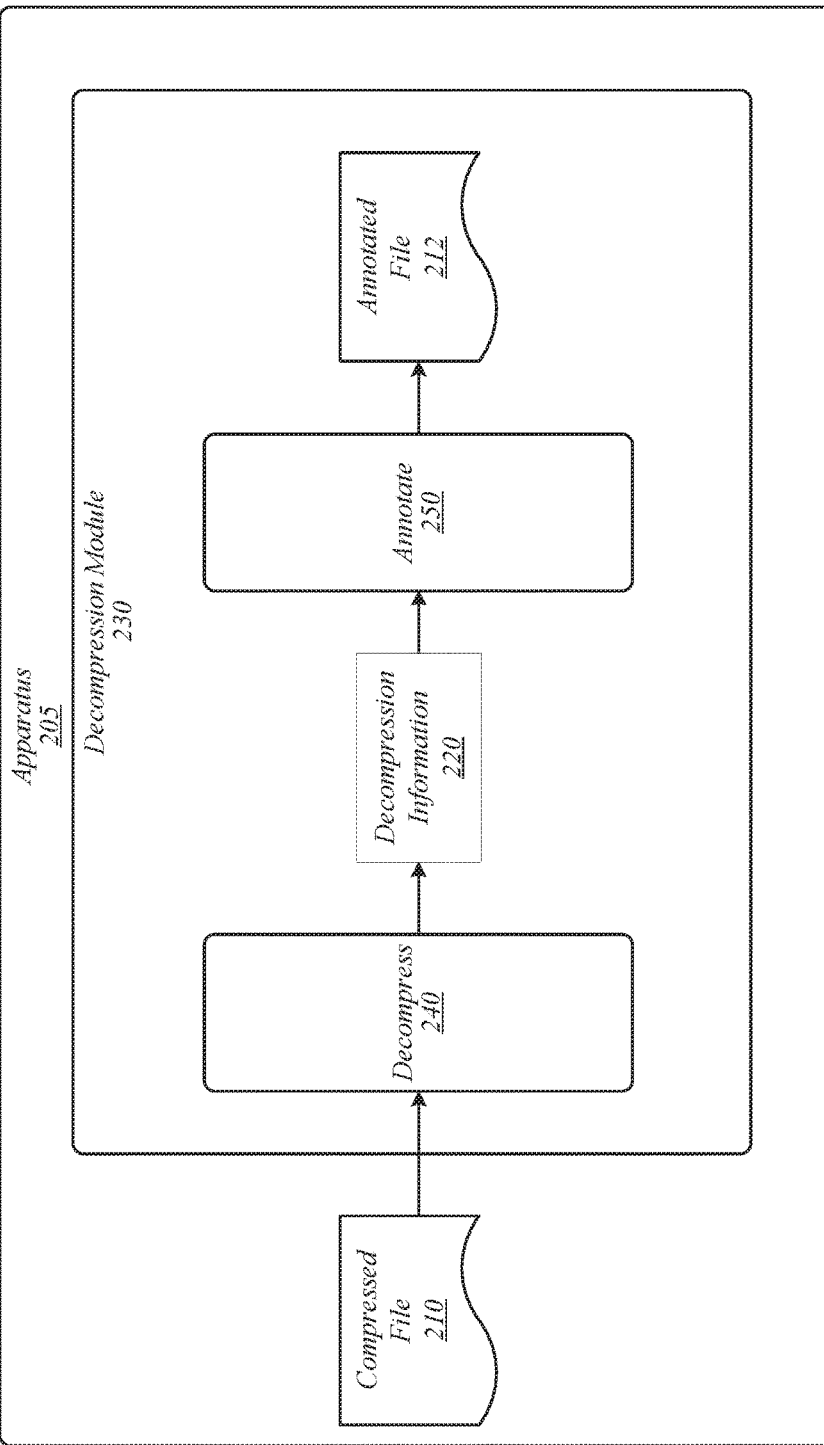
FIG. 2 illustrates an embodiment of a second operating environment.

FIG. 2 illustrates an example of an operating environment 200 that may be representative of various embodiments. The operating environment 200 depicted in FIG. 2 may include an apparatus 205 having a compression module 230. As shown in FIG. 2, compression module may receive, obtain, generate, or otherwise access a compressed file 210. In some embodiments, compressed file 210 may not be annotated. Compressed file 210 may include a file compressed using various compression techniques known in the art, including, without limitation, LZ77, LZ4, Deflate, and/or the like. In some embodiments, compressed file 210 may include a gzip file.

Decompression module 230, for instance, via annotation component 150, may decompress 240 compressed file 210 and/or portions of compressed file 210. In some embodiments, only a predetermined portion of compressed file 210 may be decompressed 240, such as a header portion. In some embodiments, because compressed file 210 is not annotated and, therefore, is in a conventional or "old" format, conventional compression techniques may be used to decompress 240 compressed file 210 and/or portions thereof. In various embodiments, compression module 230 may determine decompression information 220 for compressed file 210. Non-limiting examples of decompression information 220 may include file size, compression type, level of parallelism (for instance, how many cores and/or threads may operate in parallel to decompress compressed file), locations of portions or decompression segments of compressed file 210 (for instance, starting locations for blocks, chunks, and/or other segments), offset values, and/or the like. For instance, decompression information 220 may indicate how compressed file 210 may be segmented, for instance, into blocks, chunks, and/or the like. In some embodiments, decompression information 220 may be configured to allow a parallel decompression process to process portions of a compressed file 210 in parallel.

In some embodiments, depending on the size of compressed file 210 and/or the level of parallelism, a decompression strategy may be determined. In various embodiments, compressed file 210 may be divided, segmented, or otherwise include a plurality of decompression segments (such as blocks). In some embodiments, the blocks may be segmented into chunks. In some embodiments, the blocks may be segmented into chunks of the same or substantially the same size. In some embodiments, each core and/or thread may operate to process one decompression segment such that all file contents may be processed in parallel. For instance, a decompression strategy may include determining a number of chunks (for example, 8 chunks) of a Deflate compressed file 210, block, and/or data thereof that are approximately the same size in each Deflate block. The starting bit positions of the 8 chunks may be decompression information 220 that can be stored as metadata within compressed file 210. In some embodiments in which a Deflate compressed file 210 is being processed, the very first chunk in each block may start with the representation of the Huffman trees used for that block. The remaining chunks may point to the start of a symbol, for example, a literal/length symbol, such that chunk sizes are equal or substantially equal. Accordingly, in some embodiments, decompression information 220 may include a list of bit offsets for each block and each chunk of a block. For instance, decompression information 220 may have the following general form: bit_offset[block$_i$][chunk$_j$].

In some embodiments, for example, to preserve space and maintain a compression ratio, each bit_offset may be stored as a 64-bit integer. For example, a typical Deflate block may represent about 100 KB of input data. If a parallel decompression process operated using 8-way parallelism, 8 bit_offset integers may be added as decompression information (for instance, metadata) for a data overhead of 64 bytes. In some embodiments, for instance, involving smaller files, decompression information may be stored with an absolute value for the start of a Deflate block, followed by smaller delta fields representing offset from a previous position. In a gzip file, such as at the optional comment section (see, for example, FIG. 3), zero bytes may not be used as this may signal the end of the string in that field. Accordingly, in some embodiments, each byte in the decompression information field (metadata field) may have the most significant bit reserved and set to 1 (therefore, only 7 bits of data may be used in each byte).

Decompression module 230 may use decompression information 220 to annotate 250 compressed file 210 or a portion of compressed file 210 to generate annotated file 212. For example, compressed file 210 may include a gzip file. Compression module 230 may operate to annotate compressed file 210 for a certain level of parallelism, in particular, N-way parallelism, where N represents the parallel cores or threads operating to decompress annotated file 212. In some embodiments, compressed file 210 may be annotated 250 with encrypted or otherwise obfuscated decompression information 220 (for instance, encrypted metadata). Compression module may annotate 250 to include decompression information 220 in annotated file 212 in a manner that a decompression module may locate and process decompression information 220 during a parallel decompression process. For instance, decompression information 220 may be added to annotated file 212 in one or more standard locations, associated with one or more indicators (for instance, a sequence of symbols), and/or the like.

In various embodiments, decompression module 230 may decompress compressed file 210 to determine decompression information 220 in the form of decompression segments including the starting bit positions of each Deflate block and, therefore, the size of each block in bits. For each block, N−1 index points may be created as the bit-position of the first literal/length symbol found at or after the following: {(block size)/N, (2)*((block size)/N), . . . , (N−1)*((block size)/N)}. The N bit positions per block may be stored as decompression information 220 (for instance, as metadata) within compressed file 212.

Referring to FIG. 3, therein is depicted an example of a portion of an illustrative file 210. More specifically, FIG. 3 depicts a file header 305 of a gzip file. The file header 305 may include various standard entries, including a "file comment present" entry to indicate whether a comment 330 is included in the file. In some embodiments, the decompression information 220 may be stored as metadata within the typically unused/optional comment 330 section of the header of a compressed file 210, such as a gzip file. Accordingly, in some embodiments, previously-compressed files that do not include decompression information 220 may be modified and used for parallel decompression processes. In addition, annotated files 212 compressed using a conventional process may be decompressed using an associated conventional decompression process because the contents of the file used by such a process have not been modified.

During a parallel decompression process, a decompression module (such as decompression module 330 of FIG. 3) may access the compressed file and search for decompression information at a known location, associated with an indicator, and/or the like. The decompression module may use the decompression information within the annotated file to perform a parallel decompression process according to some embodiments. In some embodiments, a non-compressed file may be annotated while being initially compressed. However, the ability to annotate previously-compressed files allows parallel compression processes according to some embodiments to operate with compressed files regardless of origin. In some embodiments, all of a compressed file is not decompressed. For instance, in some embodiments, only the header of a compressed file and/or portions of a decompressed file used to determine decompression information may be decompressed. For an illustrative gzip file, only the Deflate bit stream necessary to determine suitable indexing points may be decompressed and used to annotate the gzip header. In some embodiments, a decompressed annotated file and/or decompressed portions thereof may be recompressed. In some embodiments, recompression of files decompressed to determine decompression information may not be performed.

Figure 4:
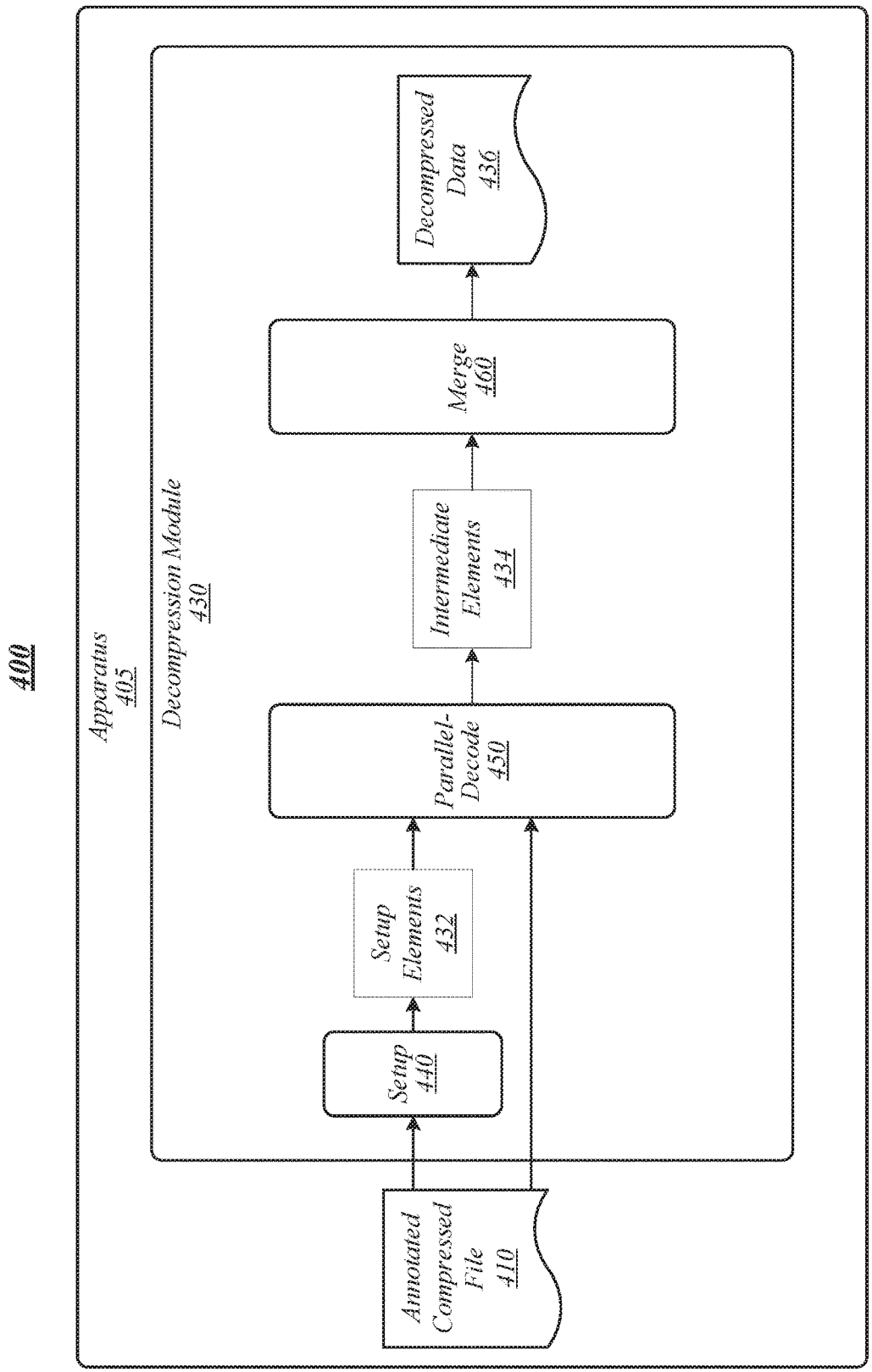
FIG. 4 illustrates an embodiment of a third operating environment.

FIG. 4 illustrates an example of an operating environment 400 that may be representative of various embodiments. The operating environment 400 depicted in FIG. 4 may include an apparatus 405 having a decompression module 430 configured to perform a parallel decompression process according to some embodiments. As shown in FIG. 4, decompression module 430 may receive, access, generate, or otherwise obtain an annotated compressed file 410. In some embodiments, decompression module 430 may verify or otherwise determine whether annotated compressed file 410 contains annotations according to some embodiments. If annotated compressed file 410 does not contain annotations, contains erroneous annotations, or otherwise cannot be decompressed using parallel decompression processes according to some embodiments, decompression module 430 may decompress annotated compressed file 410 using conventional decompression techniques and/or annotate annotated compressed file 410 (see, for example, FIG. 2).

If annotated compressed file 410 is annotated according to some embodiments, decompression module 430 initiates a setup phase 440 to generate one or more setup elements 432. In general, setup elements 432 may include data structures used by decompression module 430 during the parallel decompression process. Non-limiting examples of setup elements 432 may include arrays, vectors, lists, trees, Huffman trees, tables, lookup tables, and/or the like. In general, setup elements 432 may be used to store and/or manipulate data during a parallel decompression process. In some embodiments, setup phase 440 may operate to read the decompression information included in annotated compressed file 410. For example, setup phase 440 may read the metadata from the gzip header of an annotated gzip file and construct an array of starting bit positions in each deflate block of the compressed file. In some embodiments, such an array may be in the form of starts[N], where N is the number of parallel cores and/or threads that may be active in the parallel decompression process. N may have various values, including, without limitation, 2, 3, 4, 5, 6, 7, 8, 9, 10, 16, 32, 64, 128, 200, 500, 1000, and any value or range between any two of these values (including endpoints). In some embodiments, N may be greater than 1000.

In various embodiments, setup phase 440 may generate setup elements 432 that include lookup tables needed for fast decompression using the Huffman trees specified in the first chunk of the block. In some embodiments, for example, starts[0] may be set to the bit position of the first symbol to be decoded in a first block.

A parallel-decode phase 450 may operate to perform a parallel decompression process on the decompression segments of annotated compressed file 410 based on setup elements 432. Decompression module 430 may use N cores and/or threads to perform an N-way parallel decompression process. In some embodiments, decompression module 430 may include, execute, cause the execution of, and/or otherwise communicate with or control the N cores and/or threads performing the N-way parallel compression process. In some embodiments, parallel-decode phase 450 may perform the following parallel-decode process recited in pseudo-code form:

```
for(i=0; i<N ; i++){
    decode_and_transcode_to_simple_format
    (Huffman-tables,, input, starts [i],
    starts[i+1], temp_i)
}.
```

The parallel-decode process may be performed on each segment of the input (for instance, chunks, blocks, and/or the like). In some embodiments, the parallel-decode process may be performed in parallel on N parallel cores and/or threads in which there are N temporary buffers (temp_i) and. In various embodiments, the parallel decode process may not overrun the specific segment that is being decompressed because starts[i+1] is out of bounds for each core and/or thread.

Figure 5:
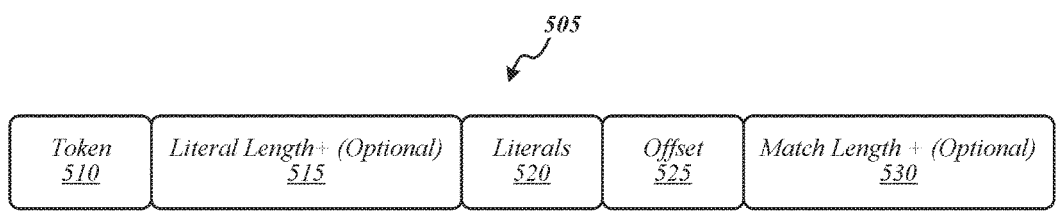
FIG. 5 illustrates an example of an intermediate element according to an embodiment.

In some embodiments, parallel-decode phase 450 may generate intermediate elements 434 (see, for example, FIG. 5). In some embodiments, the intermediate elements 434 may be defined for intermediate transcoded temp_i buffers. For example, the parallel cores and/or threads operating in the parallel-decode phase 450 may "parse" the compressed input and generate intermediate elements 434 in a common format. The parallel cores and/or threads may read the intermediate elements 434 during a merge phase 460 and, for example, perform a memory copy or other operation. In some embodiments, merge phase 460 may perform the following merge process recited in pseudo-code form:

```
for(i=0; i<N ; i++){
    decode_simple_format(temp_i),
    write literals or strings to output stream
}.
```

In some embodiment, parallel-decode phase 450 may generate intermediate elements 434 in temporary buffers and merge phase 460 may perform a merge process and/or a decode and merge process on intermediate elements 434. In some embodiments, merge phase 460 may include a "decode simple format" process executed on the intermediate elements 434 and a write process operative to write literals or strings to an output stream. In various embodiments, merge phase 460 may operate to decode intermediate elements 434. Merge phase 460 may generate output that may include or may become decompressed data 436, for instance, in the form of a decompressed file or stream of annotated compressed file 410.

In some embodiments, merge 460 may be performed as a sequential process. In some embodiments, merge 460 may be performed in parallel on a plurality of the intermediate elements. In various embodiments, parallel-decode 450 and merge 460 may be performed for each segment, such as each block or chunk. In some embodiments, decompression module 430 may process all blocks in parallel, for instance, for (N)*(number of blocks) parallelism.

FIG. 5 depicts an illustrative intermediate element according to an embodiment. As shown in FIG. 5, an intermediate element 505 may include a sequence of segmented information, such as a sequence of bits. In some embodiments, intermediate element 505 may be defined to have a base form similar to sequences used in Lempel-Ziv (LZ)-based encoding/decoding processes. For instance, intermediate element 505 may have a base form based on an LZ4 sequence.

In some embodiments, intermediate element 505 may include a token 510, a literal length 515, literals 520, an offset 525, and a match length 530. In some embodiments, token 510 may have a size of 1 byte. In some embodiments, literal length 515 may have a size of 0-n bytes, literals 520 may include 0-Lbytes, offset 525 may include 2 bytes (for instance, little endian), and match length may include 0-n bytes.

For an LZ4 sequence, the size of matches may be encoded as "len−4." In some embodiments, the length may be encoded directly (for instance, "len−0"). In some embodiments, a minimum number of matches no smaller than "min" may be supported and the length may be encoded as "len−(min−1)." In some embodiments, encoding the size of a match as "0" may imply that there is no match, allowing for encoding of back-to-back literal runs with no intervening match. For an LZ4 sequence, there are restrictions for the end of the block, particularly if the last sequence is only a partial one. However, in some embodiments, intermediate element 505 may not have such restrictions and the last sequence may be formed to be a complete sequence (for instance, the last sequence may include 0 or more literals followed by a 0 or non-zero match).

Included herein are one or more logic flows representative of exemplary methodologies for performing novel aspects of the disclosed architecture. While, for purposes of simplicity of explanation, the one or more methodologies shown herein are shown and described as a series of acts, those skilled in the art will understand and appreciate that the methodologies are not limited by the order of acts. Some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all acts illustrated in a methodology may be required for a novel implementation.

A logic flow may be implemented in software, firmware, hardware, or any combination thereof. In software and firmware embodiments, a logic flow may be implemented by computer executable instructions stored on a non-transitory computer readable medium or machine readable medium, such as an optical, magnetic or semiconductor storage. The embodiments are not limited in this context.

Figure 6:
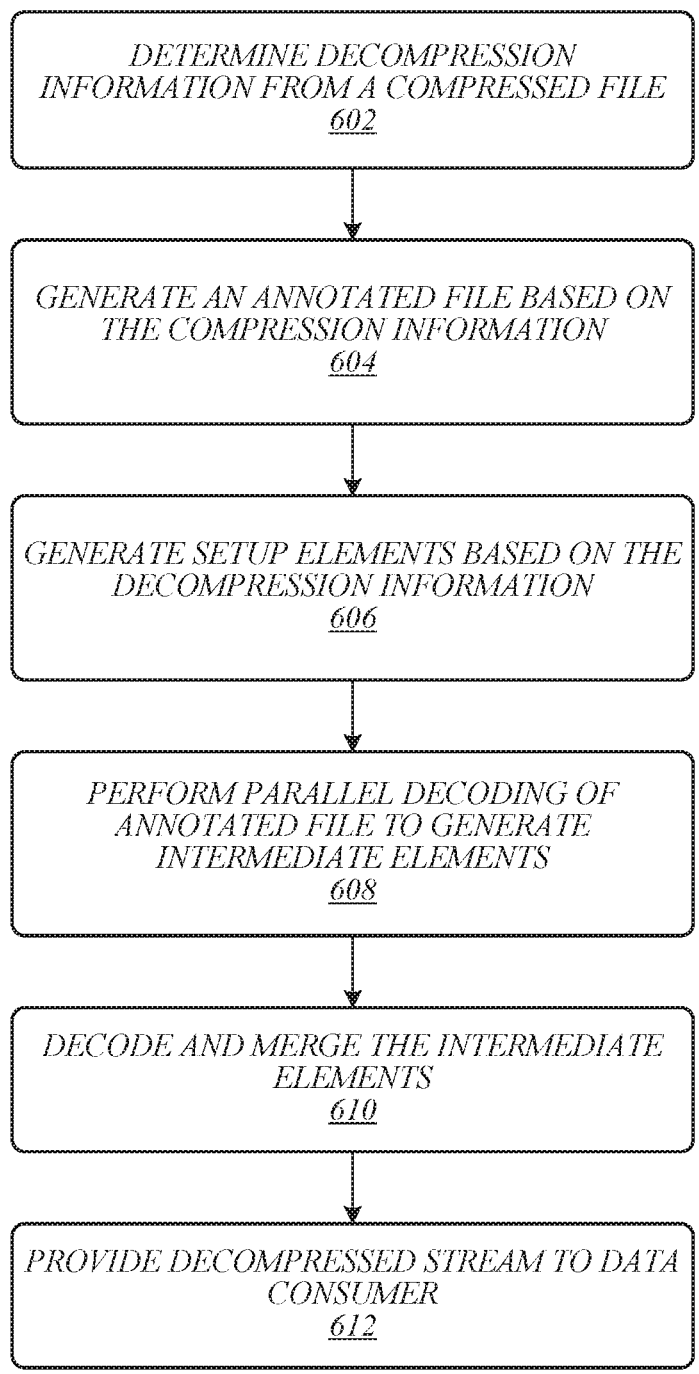
FIG. 6 illustrates an embodiment of a first logic flow.

FIG. 6 illustrates an embodiment of a logic flow 600. The logic flow 600 may be representative of some or all of the operations executed by one or more embodiments described herein, such as apparatus 105, 205, and/or 405, for instance, via one of decompression module 130, 230, and/or 430. In some embodiments, logic flow 600 may be representative of some or all of the operations of a parallel multi-stream compression process.

In the illustrated embodiment shown in FIG. 6, logic flow 600 at block 602 may determine decompression information from a compressed file. For example, decompression module 230 may access and decompress 240 a compressed file 210 or a portion of compressed file 210 to determine decompression information 220. In some embodiments, decompression information 220 may be configured to allow a parallel decompression process to process portions of a compressed file 210 in parallel. For instance, decompression information 220 may have the following general form: bit_offset[primary segment$_i$][secondary segment$_j$], where the secondary segments are sub-segments of the primary segment. For instance, a primary segment may be a block and a secondary segment may be chunks of the blocks such that decompression information 220 may have the following general form bit_offset[block$_i$][chunk$_j$], At block 604, logic flow 600 may generate an annotated file based on the decompression information. For example, decompression module 230 may annotate 250 compressed file 210 to include decompression information 220 in annotated file 212 in a manner that a decompression module may locate and process decompression information 220 during a parallel decompression process. For instance, decompression information 220 may be added to annotated file 212 in one or more standard locations, associated with one or more indicators (for instance, a sequence of symbols), and/or the like.

Logic flow 600 may generate setup elements based on the decompression information at block 606. For example, decompression module 430 may perform setup phase 440 to read the decompression information included in annotated compressed file 410. In various embodiments, setup phase 440 may generate setup elements 432 that may include data structures used by decompression module 430 to store and/or manipulate data during the parallel decompression process. Non-limiting examples of setup elements 432 may include arrays, vectors, lists, trees, Huffman trees, tables, lookup tables, and/or the like.

At block 608, logic flow 600 may perform parallel decoding of the annotated file to generate intermediate elements. For example, the parallel cores and/or threads operating in the parallel-decode phase 450 may "parse" the compressed input and generate intermediate elements 434 in a common format. In some embodiments, intermediate elements 505 may include a token 510, a literal length 515, literals 520, an offset 525, and a match length 530.

Logic flow 600 may decode and merge the intermediate elements at block 610. For example, parallel cores and/or threads may read the intermediate elements 434 during a merge phase 460 and, for example, perform a memory copy or other operation. In some embodiments, merge phase 460 may perform a merge process and/or a decode and merge process on intermediate elements 434 to generate output that may include or may become decompressed data 436, for instance, in the form of a decompressed file or stream of annotated compressed file 410. At block 612, logic flow 600 may provide decompressed stream to a data consumer. For example, in some embodiments, data output interface 180 may access decompressed data stored within data buffer 170 for transmission to a data consumer of the decompressed data (for instance, a software application, an apparatus component, such as processor circuit 110, transceiver 120, and/or the like)

FIG. 7 illustrates an example of a storage medium 700. Storage medium 700 may comprise an article of manufacture. In some examples, storage medium 700 may include any non-transitory computer readable medium or machine readable medium, such as an optical, magnetic or semiconductor storage. Storage medium 700 may store various types of computer executable instructions, such as instructions to implement logic flow 600. Examples of a computer readable or machine readable storage medium may include any tangible media capable of storing electronic data, including volatile memory or non-volatile memory, removable or non-removable memory, erasable or non-erasable memory, writeable or re-writeable memory, and so forth. Examples of computer executable instructions may include any suitable type of code, such as source code, compiled code, interpreted code, executable code, static code, dynamic code, object-oriented code, visual code, and the like. The examples are not limited in this context.

Figure 8:
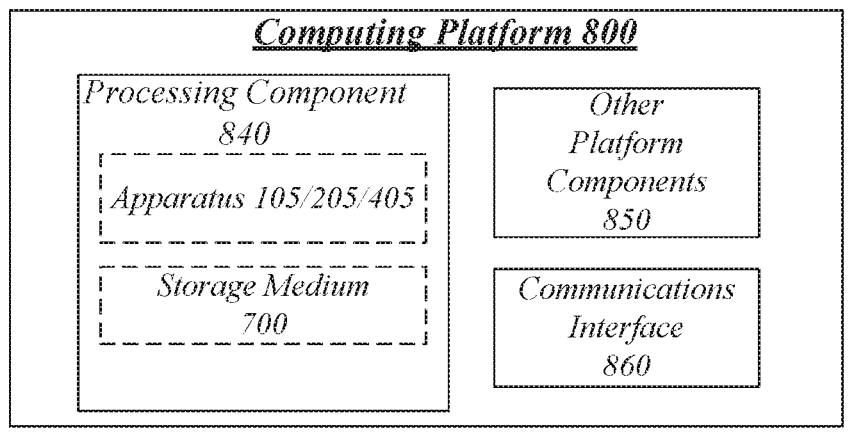
FIG. 8 illustrates an example computing platform.

FIG. 8 illustrates an example computing platform 800. In some examples, as shown in FIG. 8, computing platform 800 may include a processing component 840, other platform components or a communications interface 860. According to some examples, computing platform 800 may be implemented in a computing device such as a server in a system such as a data center. Embodiments are not limited in this context.

According to some examples, processing component 840 may execute processing operations or logic for one of apparatus 105, 205, or 405 and/or storage medium 700. Processing component 840 may include various hardware elements, software elements, or a combination of both. Examples of hardware elements may include devices, logic devices, components, processors, microprocessors, circuits, processor circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), memory units, logic gates, registers, semiconductor device, chips, microchips, chip sets, and so forth. Examples of software elements may include software components, programs, applications, computer programs, application programs, device drivers, system programs, software development programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given example.

In some examples, other platform components 850 may include common computing elements, such as one or more processors, multi-core processors, co-processors, memory units, chipsets, controllers, peripherals, interfaces, oscillators, timing devices, video cards, audio cards, multimedia input/output (I/O) components (e.g., digital displays), power supplies, and so forth. Examples of memory units may include without limitation various types of computer readable and machine readable storage media in the form of one or more higher speed memory units, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, an array of devices such as Redundant Array of Independent Disks (RAID) drives, solid state memory devices (e.g., USB memory), solid state drives (SSD) and any other type of storage media suitable for storing information.

In some examples, communications interface 860 may include logic and/or features to support a communication interface. For these examples, communications interface 860 may include one or more communication interfaces that operate according to various communication protocols or standards to communicate over direct or network communication links. Direct communications may occur via use of communication protocols or standards described in one or more industry standards (including progenies and variants) such as those associated with the PCI Express specification. Network communications may occur via use of communication protocols or standards such those described in one or more Ethernet standards promulgated by the Institute of Electrical and Electronics Engineers (IEEE). For example, one such Ethernet standard may include IEEE 802.3-2012, Carrier sense Multiple access with Collision Detection (CSMA/CD) Access Method and Physical Layer Specifications, Published in December 2012 (hereinafter "IEEE 802.3"). Network communication may also occur according to one or more OpenFlow specifications such as the OpenFlow Hardware Abstraction API Specification. Network communications may also occur according to Infiniband Architecture Specification, Volume 1, Release 1.3, published in March 2015 ("the Infiniband Architecture specification").

Computing platform 800 may be part of a computing device that may be, for example, a server, a server array or server farm, a web server, a network server, an Internet server, a work station, a mini-computer, a main frame computer, a supercomputer, a network appliance, a web appliance, a distributed computing system, multiprocessor systems, processor-based systems, or combination thereof. Accordingly, functions and/or specific configurations of computing platform 800 described herein, may be included or omitted in various embodiments of computing platform 800, as suitably desired.

The components and features of computing platform 800 may be implemented using any combination of discrete circuitry, ASICs, logic gates and/or single chip architectures. Further, the features of computing platform 800 may be implemented using microcontrollers, programmable logic arrays and/or microprocessors or any combination of the foregoing where suitably appropriate. It is noted that hardware, firmware and/or software elements may be collectively or individually referred to herein as "logic" or "circuit."

It should be appreciated that the exemplary computing platform 800 shown in the block diagram of FIG. 8 may represent one functionally descriptive example of many potential implementations. Accordingly, division, omission or inclusion of block functions depicted in the accompanying figures does not infer that the hardware components, circuits, software and/or elements for implementing these functions would necessarily be divided, omitted, or included in embodiments.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor. Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

The following examples pertain to further embodiments:

Example 1 is an apparatus to provide parallel decompression, the apparatus comprising at least one memory, and logic for a decompression component, at least a portion of the logic comprised in hardware coupled to the at least one memory, the logic to determine decompression information of a compressed data unit, annotate the compressed data unit with at least a portion of the decompression information to generate an annotated data unit, parallel-decode the annotated data unit to generate a plurality of intermediate elements, and decode and merge the plurality of intermediate elements to generate a decompressed data unit.

Example 2 is the apparatus of Example 1, the compressed data unit comprising a data stream compressed using one of an LZ77 compression process or a Deflate compression process.

Example 3 is the apparatus of Example 1, the compressed data unit comprising a data stream compressed using an LZ77 compression process.

Example 4 is the apparatus of Example 1, the compressed data unit comprising a data stream compressed using a Deflate compression process.

Example 5 is the apparatus of Example 1, the logic to decompress at least a portion of the compressed data unit to determine the decompression information.

Example 6 is the apparatus of Example 1, the logic to decompress at least a portion of the compressed data unit to determine the decompression information, the decompression information comprising index values of the compressed data unit.

Example 7 is the apparatus of Example 1, the logic to parallel-decode the annotated data unit based on a level of parallelism.

Example 8 is the apparatus of Example 1, the logic to parallel-decode the annotated data unit based on a level of parallelism, the level of parallelism to indicate a number of cores or threads to parallel-decode the annotated data unit.

Example 9 is the apparatus of Example 1, the logic to annotate the compressed data unit within a compression process.

Example 10 is the apparatus of Example 1, the logic to annotate a header portion of the compressed data unit to generate the annotated data unit.

Example 11 is the apparatus of Example 1, the logic to annotate a comment section of the compressed data unit to generate the annotated data unit.

Example 12 is the apparatus of Example 1, the logic to annotate the compressed data unit using metadata to represent the decompression information.

Example 13 is the apparatus of Example 1, the decompression information indicating position information of at least one decompression segment of the compressed data unit.

Example 14 is the apparatus of Example 1, the decompression information indicating position information of at least one decompression segment of the compressed data unit, the at least one decompression segment comprising one of at least one block or at least one chunk.

Example 15 is the apparatus of Example 1, the logic to determine a number of chunks for the compressed data unit based on a plurality of blocks of the compressed data unit.

Example 16 is the apparatus of Example 1, the logic to determine a number of chunks for the compressed data unit based on a level of parallelism.

Example 17 is the apparatus of Example 1, the logic to determine a number of chunks for the compressed data unit based on a level of parallelism and a plurality of blocks of the compressed data unit.

Example 18 is the apparatus of Example 1, the logic to determine a number of chunks for the compressed data unit and annotate the compressed data unit to include a starting bit position for each chunk.

Example 19 is the apparatus of Example 1, the logic to determine a number of chunks for each block of the compressed data unit, a starting bit position of each chunk to start with a representation of a Huffman tree used for the block.

Example 20 is the apparatus of Example 1, the logic to determine a number of chunks for each block of the compressed data unit, a starting bit position of each chunk to start with a representation of a Huffman tree used for the block and a remainder of bit positions pointing to a symbol of the block.

Example 21 is the apparatus of Example 1, the decompression information comprising bit_offset[primary segmenti][secondary segmentj].

Example 22 is the apparatus of Example 1, the decompression information comprising bit_offset[blocki][chunkj].

Example 23 is the apparatus of Example 1, the logic to generate at least one setup element based on the decompression information.

Example 24 is the apparatus of Example 1, the logic to generate at least one setup element based on the decompression information, the at least one setup element comprising at least one of a Huffman tree, a lookup table, an array, or a vector.

Example 25 is the apparatus of Example 1, the logic to generate at least one setup element based on the decompression information, the at least one setup element comprising a lookup table.

Example 26 is the apparatus of Example 1, the logic to provide the decompressed data unit to at least one data consumer.

Example 27 is the apparatus of Example 1, the logic to verify that the annotated file includes annotations.

Example 28 is the apparatus of Example 1, the logic to perform parallel-decode having a pseudo-code form of:

```
for(i=0, i<N , i++){
decode_and_transcode_to_simple_format
(Huffman-tables,, input, starts[i],
starts[i+1], temp_i)}.
```

Example 29 is the apparatus of Example 1, the logic to perform decode and merge having a pseudo-code form of:

```
for(i=0, i<N , i++){
decode_simple_format(temp_i),
write literals or strings to output stream}.
```

Example 30 is the apparatus of Example 1, the logic to parallel-decode the annotated data unit to generate a plurality of intermediate elements, each of the plurality of intermediate elements comprising an LZ4-based sequence of data.

Example 31 is the apparatus of Example 1, the logic to parallel-decode the annotated data unit to generate a plurality of intermediate elements, each of the plurality of intermediate elements comprising a sequence of data for decompressing the annotated data unit.

Example 32 is the apparatus of Example 1, the logic to decode and merge the plurality of intermediate elements in parallel to generate the decompressed data unit.

Example 33 is the apparatus of Example 1, the logic to parallel-decode the annotated data unit to generate a plurality of intermediate elements, each of the plurality of intermediate elements comprising at least one token, at least one literal length, at least one literal, at least one offset, or at least one match length.

Example 34 is a system to provide parallel decompression, comprising an apparatus according to any of Examples 1 to 33, and at least one radio frequency (RF) transceiver.

Example 35 is a method to provide parallel decompression, the method comprising determining decompression information of a compressed data unit, annotating the compressed data unit with at least a portion of the decompression information to generate an annotated data unit, parallel-decoding the annotated data unit to generate a plurality of intermediate elements, and decoding and merging the plurality of intermediate elements to generate a decompressed data unit.

Example 36 is the method of Example 35, the compressed data unit comprising a data stream compressed using one of an LZ77 compression process or a Deflate compression process.

Example 37 is the method of Example 35, the compressed data unit comprising a data stream compressed using an LZ77 compression process.

Example 38 is the method of Example 35, the compressed data unit comprising a data stream compressed using a Deflate compression process.

Example 39 is the method of Example 35, comprising decompressing at least a portion of the compressed data unit to determine the decompression information.

Example 40 is the method of Example 35, comprising decompressing at least a portion of the compressed data unit to determine the decompression information, the decompression information comprising index values of the compressed data unit.

Example 41 is the method of Example 35, comprising parallel-decoding the annotated data unit based on a level of parallelism.

Example 42 is the method of Example 35, comprising parallel-decoding the annotated data unit based on a level of parallelism, the level of parallelism to indicate a number of cores or threads to parallel-decode the annotated data unit.

Example 43 is the method of Example 35, comprising annotating the compressed data unit within a compression process.

Example 44 is the method of Example 35, comprising annotating a header portion of the compressed data unit to generate the annotated data unit.

Example 45 is the method of Example 35, comprising annotating a comment section of the compressed data unit to generate the annotated data unit.

Example 46 is the method of Example 35, comprising annotating the compressed data unit using metadata to represent the decompression information.

Example 47 is the method of Example 35, the decompression information indicating position information of at least one decompression segment of the compressed data unit.

Example 48 is the method of Example 35, the decompression information indicating position information of at least one decompression segment of the compressed data unit, the at least one decompression segment comprising one of at least one block or at least one chunk.

Example 49 is the method of Example 35, comprising determining a number of chunks for the compressed data unit based on a plurality of blocks of the compressed data unit.

Example 50 is the method of Example 35, comprising determining a number of chunks for the compressed data unit based on a level of parallelism.

Example 51 is the method of Example 35, comprising determining a number of chunks for the compressed data unit based on a level of parallelism and a plurality of blocks of the compressed data unit.

Example 52 is the method of Example 35, comprising determining a number of chunks for the compressed data unit and annotate the compressed data unit to include a starting bit position for each chunk.

Example 53 is the method of Example 35, comprising determining a number of chunks for each block of the compressed data unit, a starting bit position of each chunk to start with a representation of a Huffman tree used for the block.

54 is the method of Example 35, comprising determining a number of chunks for each block of the compressed data unit, a starting bit position of each chunk to start with a representation of a Huffman tree used for the block and a remainder of bit positions pointing to a symbol of the block.

Example 55 is the method of Example 35, the decompression information comprising bit_offset[primary segmenti][secondary segmentj].

Example 56 is the method of Example 35, the decompression information comprising bit_offset[blocki][chunkj].

Example 57 is the method of Example 35, comprising generating at least one setup element based on the decompression information.

Example 58 is the method of Example 35, comprising generating at least one setup element based on the decompression information, the at least one setup element comprising at least one of a Huffman tree, a lookup table, an array, or a vector.

Example 59 is the method of Example 35, comprising generating at least one setup element based on the decompression information, the at least one setup element comprising a lookup table.

Example 60 is the method of Example 35, comprising providing the decompressed data unit to at least one data consumer.

Example 61 is the method of Example 35, comprising verifying that the annotated file includes annotations.

Example 62 is the method of Example 35, comprising performing parallel-decode having a pseudo-code form of:

```
for(i=0, i<N , i++){
    decode_and_transcode_to_simple_format
    (Huffman-tables,, input,
    starts [i], starts[i+1], temp_i)}.
```

Example 63 is the method of Example 35, comprising performing decode and merge having a pseudo-code form of:

```
for(i=0, i<N , i++){
    decode_simple_format(temp_i),
    write literals or strings to output stream}.
```

Example 64 is the method of Example 35, comprising parallel-decoding the annotated data unit to generate a plurality of intermediate elements, each of the plurality of intermediate elements comprising an LZ4-based sequence of data.

Example 65 is the method of Example 35, comprising parallel-decoding the annotated data unit to generate a plurality of intermediate elements, each of the plurality of intermediate elements comprising an LZ4-based sequence of data.

Example 66 is the method of Example 35, comprising parallel-decoding the annotated data unit to generate a plurality of intermediate elements, and merging and decoding the plurality of intermediate elements to generate the decompressed data unit.

Example 67 is the method of Example 35, comprising parallel-decoding the annotated data unit to generate a plurality of intermediate elements, each of the plurality of intermediate elements comprising at least one token, at least one literal length, at least one literal, at least one offset, or at least one match length.

Example 68 is a system to provide parallel decompression, comprising at least one memory, and logic, at least a portion of which is comprised in hardware coupled to the at least one memory, the logic to perform a method according to any of Examples 35-67.

Example 69 is a computer-readable storage medium that stores instructions for execution by processing circuitry of a computing device to provide parallel decompression, the instructions to cause the computing device to determine decompression information of a compressed data unit, annotate the compressed data unit with at least a portion of the decompression information to generate an annotated data unit, parallel-decode the annotated data unit to generate a plurality of intermediate elements, and decode and merge the plurality of intermediate elements to generate a decompressed data unit.

Example 70 is the computer-readable storage medium of Example 69, the compressed data unit comprising a data stream compressed using one of an LZ77 compression process or a Deflate compression process.

Example 71 is the computer-readable storage medium of Example 69, the compressed data unit comprising a data stream compressed using an LZ77 compression process.

Example 72 is the computer-readable storage medium of Example 69, the compressed data unit comprising a data stream compressed using a Deflate compression process.

Example 73 is the computer-readable storage medium of Example 69, the logic to decompress at least a portion of the compressed data unit to determine the decompression information.

Example 74 is the computer-readable storage medium of Example 69, the instructions to cause the computing device to decompress at least a portion of the compressed data unit to determine the decompression information, the decompression information comprising index values of the compressed data unit.

Example 75 is the computer-readable storage medium of Example 69, the instructions to cause the computing device to parallel-decode the annotated data unit based on a level of parallelism.

Example 76 is the computer-readable storage medium of Example 69, the instructions to cause the computing device to parallel-decode the annotated data unit based on a level of parallelism, the level of parallelism to indicate a number of cores or threads to parallel-decode the annotated data unit.

Example 77 is the computer-readable storage medium of Example 69, the instructions to cause the computing device to annotate the compressed data unit within a compression process.

Example 78 is the computer-readable storage medium of Example 69, the instructions to cause the computing device to annotate a header portion of the compressed data unit to generate the annotated data unit.

Example 79 is the computer-readable storage medium of Example 69, the instructions to cause the computing device to annotate a comment section of the compressed data unit to generate the annotated data unit.

Example 80 is the computer-readable storage medium of Example 69, the instructions to cause the computing device to annotate the compressed data unit using metadata to represent the decompression information.

Example 81 is the computer-readable storage medium of Example 69, the decompression information indicating position information of at least one decompression segment of the compressed data unit.

Example 82 is the computer-readable storage medium of Example 69, the decompression information indicating position information of at least one decompression segment of the compressed data unit, the at least one decompression segment comprising one of at least one block or at least one chunk.

Example 83 is the computer-readable storage medium of Example 69, the instructions to cause the computing device to determine a number of chunks for the compressed data unit based on a plurality of blocks of the compressed data unit.

Example 84 is the computer-readable storage medium of Example 69, the instructions to cause the computing device to determine a number of chunks for the compressed data unit based on a level of parallelism.

Example 85 is the computer-readable storage medium of Example 69, the instructions to cause the computing device to determine a number of chunks for the compressed data unit based on a level of parallelism and a plurality of blocks of the compressed data unit.

Example 86 is the computer-readable storage medium of Example 69, the instructions to cause the computing device to determine a number of chunks for the compressed data unit and annotate the compressed data unit to include a starting bit position for each chunk.

Example 87 is the computer-readable storage medium of Example 69, the instructions to cause the computing device to determine a number of chunks for each block of the compressed data unit, a starting bit position of each chunk to start with a representation of a Huffman tree used for the block.

Example 88 is the computer-readable storage medium of Example 69, the instructions to cause the computing device to determine a number of chunks for each block of the compressed data unit, a starting bit position of each chunk to start with a representation of a Huffman tree used for the block and a remainder of bit positions pointing to a symbol of the block.

Example 89 is the computer-readable storage medium of Example 69, the decompression information comprising bit_offset[primary segmenti][secondary segmentj].

Example 90 is the computer-readable storage medium of Example 69, the decompression information comprising bit_offset[blocki][chunkj].

Example 91 is the computer-readable storage medium of Example 69, the instructions to cause the computing device to generate at least one setup element based on the decompression information.

Example 92 is the computer-readable storage medium of Example 69, the instructions to cause the computing device to generate at least one setup element based on the decompression information, the at least one setup element comprising at least one of a Huffman tree, a lookup table, an array, or a vector.

Example 93 is the computer-readable storage medium of Example 69, the instructions to cause the computing device to generate at least one setup element based on the decompression information, the at least one setup element comprising a lookup table.

Example 94 is the computer-readable storage medium of Example 69, the instructions to cause the computing device to provide the decompressed data unit to at least one data consumer.

Example 95 is the computer-readable storage medium of Example 69, the instructions to cause the computing device to verify that the annotated file includes annotations.

Example 96 is the computer-readable storage medium of Example 69, the instructions to cause the computing device to perform parallel-decode having a pseudo-code form of:

```
for(i=0, i<N , i++){
    decode_and_transcode_to_simple_format
    (Huffman-tables,, input, starts[i],
    starts[i+1], temp_i)}.
```

Example 97 is the computer-readable storage medium of Example 69, the instructions to cause the computing device to perform decode and merge having a pseudo-code form of:

```
for(i=0, i<N , i++){
    decode_simple_format(temp_i),
    write literals or strings to output stream}.
```

Example 98 is the computer-readable storage medium of Example 69, the instructions to cause the computing device to parallel-decode the annotated data unit to generate a plurality of intermediate elements, each of the plurality of intermediate elements comprising an LZ4-based sequence of data.

Example 99 is the computer-readable storage medium of Example 69, the instructions to cause the computing device to parallel-decode the annotated data unit to generate a plurality of intermediate elements, each of the plurality of intermediate elements comprising a sequence of data for decompressing the annotated data unit.

Example 100 is the computer-readable storage medium of Example 69, the instructions to cause the computing device to decode and merge the plurality of intermediate elements in parallel to generate the decompressed data unit.

Example 101 is the computer-readable storage medium of Example 69, the instructions to cause the computing device to parallel-decode the annotated data unit to generate a plurality of intermediate elements, each of the plurality of intermediate elements comprising at least one token, at least one literal length, at least one literal, at least one offset, or at least one match length.

Example 102 is an apparatus to provide parallel decompression, the apparatus comprising an information determination means to determine decompression information of a compressed data unit, an annotating means to annotate the compressed data unit with at least a portion of the decompression information to generate an annotated data unit, a parallel-decoding means to parallel-decode the annotated data unit to generate a plurality of intermediate elements, and a merging means to decode and merge the plurality of intermediate elements to generate a decompressed data unit.

Example 103 is the apparatus of Example 102, the compressed data unit comprising a data stream compressed using one of an LZ77 compression process or a Deflate compression process.

Example 104 is the apparatus of Example 102, the compressed data unit comprising a data stream compressed using an LZ77 compression process.

Example 105 is the apparatus of Example 102, the compressed data unit comprising a data stream compressed using a Deflate compression process.

Example 106 is the apparatus of Example 102, the information determination means to decompress at least a portion of the compressed data unit to determine the decompression information.

Example 107 is the apparatus of Example 102, the information determination means to decompress at least a portion of the compressed data unit to determine the decompression information, the decompression information comprising index values of the compressed data unit.

Example 108 is the apparatus of Example 102, the parallel-decoding means to parallel-decode the annotated data unit based on a level of parallelism.

Example 109 is the apparatus of Example 102, the parallel-decoding means to parallel-decode the annotated data unit based on a level of parallelism, the level of parallelism to indicate a number of cores or threads to parallel-decode the annotated data unit.

Example 110 is the apparatus of Example 102, the annotating means to annotate the compressed data unit within a compression process.

Example 111 is the apparatus of Example 102, the annotating means to annotate a header portion of the compressed data unit to generate the annotated data unit.

Example 112 is the apparatus of Example 102, the annotating means to annotate a comment section of the compressed data unit to generate the annotated data unit.

Example 113 is the apparatus of Example 102, the annotating means to annotate the compressed data unit using metadata to represent the decompression information.

Example 114 is the apparatus of Example 102, the decompression information indicating position information of at least one decompression segment of the compressed data unit.

Example 115 is the apparatus of Example 102, the decompression information indicating position information of at least one decompression segment of the compressed data unit, the at least one decompression segment comprising one of at least one block or at least one chunk.

Example 116 is the apparatus of Example 102, the information determination means to determine a number of chunks for the compressed data unit based on a plurality of blocks of the compressed data unit.

Example 117 is the apparatus of Example 102, the information determination means to determine a number of chunks for the compressed data unit based on a level of parallelism.

Example 118 is the apparatus of Example 102, the information determination means to determine a number of chunks for the compressed data unit based on a level of parallelism and a plurality of blocks of the compressed data unit.

Example 119 is the apparatus of Example 102, the information determination means to determine a number of chunks for the compressed data unit and annotate the compressed data unit to include a starting bit position for each chunk.

Example 120 is the apparatus of Example 102, the information determination means to determine a number of chunks for each block of the compressed data unit, a starting bit position of each chunk to start with a representation of a Huffman tree used for the block.

Example 121 is the apparatus of Example 102, the information determination means to determine a number of chunks for each block of the compressed data unit, a starting bit position of each chunk to start with a representation of a Huffman tree used for the block and a remainder of bit positions pointing to a symbol of the block.

Example 122 is the apparatus of Example 102, the decompression information comprising bit_offset[primary segmenti][secondary segmentj].

Example 123 is the apparatus of Example 102, the decompression information comprising bit_offset[blocki][chunkj].

Example 124 is the apparatus of Example 102, comprising a setup means to generate at least one setup element based on the decompression information.

Example 125 is the apparatus of Example 102, comprising a setup means to generate at least one setup element based on the decompression information, the at least one setup element comprising at least one of a Huffman tree, a lookup table, an array, or a vector.

Example 126 is the apparatus of Example 102, comprising a setup means to generate at least one setup element based on the decompression information, the at least one setup element comprising a lookup table.

Example 127 is the apparatus of Example 102, comprising a communication means to provide the decompressed data unit to at least one data consumer.

Example 128 is the apparatus of Example 102, the information determination means to verify that the annotated file includes annotations.

Example 129 is the apparatus of Example 102, the parallel-decoding means to perform parallel-decode having a pseudo-code form of:

```
for(i=0, i<N , i++){
   decode_and_transcode_to_simple_format
   (Huffman-tables,, input, starts [i],
   starts[i+1], temp_i)}.
```

Example 130 is the apparatus of Example 102, the merging means to perform decode and merge having a pseudo-code form of:

```
for(i=0, i<N , i++){
decode_simple_format(temp_i),
write literals or strings to output stream}.
```

Example 131 is the apparatus of Example 102, the parallel-decoding means to parallel-decode the annotated data unit to generate a plurality of intermediate elements, each of the plurality of intermediate elements comprising an LZ4-based sequence of data.

Example 132 is the apparatus of Example 102, the parallel-decoding means to parallel-decode the annotated data unit to generate a plurality of intermediate elements, each of the plurality of intermediate elements comprising a sequence of data for decompressing the annotated data unit.

Example 133 is the apparatus of Example 102, the merging means to decode and merge the plurality of intermediate elements in parallel to generate the decompressed data unit.

Example 134 is the apparatus of Example 102, the parallel-decoding means to parallel-decode the annotated data unit to generate a plurality of intermediate elements, each of the plurality of intermediate elements comprising at least one token, at least one literal length, at least one literal, at least one offset, or at least one match length.

It should be noted that the methods described herein do not have to be executed in the order described, or in any particular order. Moreover, various activities described with respect to the methods identified herein can be executed in serial or parallel fashion.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" are used as the plain-English equivalents of the respective terms "comprising" and "wherein," respectively. Moreover, the terms "first," "second," and "third," etc. are used merely as labels, and are not intended to impose numerical requirements on their objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus to provide parallel decompression, the apparatus comprising:
    a plurality of processing cores;
    at least one memory coupled with the plurality of processing cores; and
    logic for a decompression component, at least a portion of the logic comprised in hardware coupled to the at least one memory, the logic to:
        determine decompression information of a compressed data file, the decompression information indicating position information of at least one decompression segment of the compressed data file,
        modify the compressed data file to include with the decompression information including the position information to generate an annotated data file,
        parallel-decode, via the plurality of processing cores, the annotated data file utilizing the position information in the annotated data file to generate a plurality of intermediate elements, and
        decode and merge the plurality of intermediate elements to generate a decompressed data file.

2. The apparatus of claim 1, the compressed data file comprising a data stream compressed using one of an LZ77 compression process or a Deflate compression process.

3. The apparatus of claim 1, the logic to decompress at least a portion of the compressed data file to determine the decompression information.

4. The apparatus of claim 1, the logic to parallel-decode the annotated data file based on a level of parallelism.

5. The apparatus of claim 1, the logic to annotate a header portion of the compressed data file to generate the annotated data.

6. The apparatus of claim 1, the logic to annotate a comment section of the compressed data file to generate the annotated data file.

7. The apparatus of claim 1, the logic to determine a number of chunks for the compressed data based on a plurality of blocks of the compressed data file.

8. The apparatus of claim 1, the logic to determine a number of chunks for the compressed data file based on a level of parallelism.

9. The apparatus of claim 1, the decompression information comprising bit_offset[primary segment$_i$][secondary segment$_j$].

10. The apparatus of claim 1, the logic to parallel-decode the annotated data file to generate a plurality of intermediate elements.

11. The apparatus of claim 1, the logic to parallel-decode the annotated data file to generate a plurality of intermediate elements, each of the plurality of intermediate elements comprising a sequence of data for decompressing the annotated data file.

12. The apparatus of claim 1, the logic to decode and merge the plurality of intermediate elements in parallel to generate the decompressed data file.

13. The apparatus of claim 1, the logic to parallel-decode the annotated data file to generate a plurality of intermediate elements, each of the plurality of intermediate elements comprising at least one token, at least one literal length, at least one literal, at least one offset, or at least one match length.

14. A method to provide parallel decompression, the method comprising:
- determining decompression information of a compressed data file, the decompression information indicating position information of at least one decompression segment of the compressed data file;
- modifying the compressed data file with at least a portion of the decompression information including the position information to generate an annotated data file;
- parallel-decoding, via a plurality of processing cores, the annotated data file utilizing the position information in the annotated data file to generate a plurality of intermediate elements; and
- decoding and merging the plurality of intermediate elements to generate a decompressed data file.

15. The method of claim 14, the compressed data file comprising a data stream compressed using one of an LZ77 compression process or a Deflate compression process.

16. The method of claim 14, comprising decompressing at least a portion of the compressed data file to determine the decompression information.

17. The method of claim 14, comprising annotating the compressed data file within a compression process.

18. The method of claim 14, comprising annotating a header portion of the compressed data file to generate the annotated data file.

19. The method of claim 14, comprising annotating the compressed data file using metadata to represent the decompression information.

20. A non-transitory computer-readable storage medium that stores instructions for execution by processing circuitry of a computing device to provide parallel decompression, the instructions to cause the computing device to:
- determine decompression information of a compressed data file, the decompression information indicating position information of at least one decompression segment of the compressed data file;
- modify the compressed data file with at least a portion of the decompression information including the position information to generate an annotated data file;
- parallel-decode, via a plurality of processing cores, the annotated data file utilizing the position information in the annotated data file to generate a plurality of intermediate elements; and
- decode and merge the plurality of intermediate elements to generate a decompressed data file.

21. The non-transitory computer-readable storage medium of claim 20, the compressed data file comprising a data stream compressed using one of an LZ77 compression process or a Deflate compression process.

22. The non-transitory computer-readable storage medium of claim 20, the instructions to cause the computing device to decompress at least a portion of the compressed data file to determine the decompression information.

23. The non-transitory computer-readable storage medium of claim 20, the instructions to cause the computing device to annotate a header portion of the compressed data file to generate the annotated data file.

* * * * *

UNITED STATES PATENT AND TRADEMARK OFFICE
CERTIFICATE OF CORRECTION

PATENT NO. : 10,230,392 B2
APPLICATION NO. : 15/393190
DATED : March 12, 2019
INVENTOR(S) : Vinodh Gopal and James D. Guilford Page 1 of 1

It is certified that error appears in the above-identified patent and that said Letters Patent is hereby corrected as shown below:

In the Claims

Column 24, Line 19, replace "include with the decompression" with -- include the decompression --.

Column 25, Line 8, replace "information including the position" with -- information including indicating the position --.

Column 26, Line 9, replace "information including the position" with -- information including indicating the position --.

Signed and Sealed this
Eleventh Day of February, 2020

Andrei Iancu
*Director of the United States Patent and Trademark Office*